United States Patent
Hyndman et al.

(10) Patent No.: US 10,812,035 B2
(45) Date of Patent: Oct. 20, 2020

(54) SAW DEVICE AND METHOD OF MANUFACTURE

(71) Applicant: SPTS Technologies Limited, Newport (GB)

(72) Inventors: Rhonda Hyndman, Newport (GB); Steve Burgess, Newport (GB)

(73) Assignee: SPTS Technologies Limited, Newport (GB)

(*) Notice: Subject to any disclaimer, the term of this patent is extended or adjusted under 35 U.S.C. 154(b) by 20 days.

(21) Appl. No.: 16/129,346

(22) Filed: Sep. 12, 2018

(65) Prior Publication Data

US 2019/0267962 A1    Aug. 29, 2019

(30) Foreign Application Priority Data

Sep. 12, 2017    (GB) .................... 1714646.5

(51) Int. Cl.
*H03H 3/10* (2006.01)
*H03H 9/25* (2006.01)
(Continued)

(52) U.S. Cl.
CPC .......... *H03H 3/10* (2013.01); *C23C 14/0036* (2013.01); *C23C 14/08* (2013.01); *C23C 14/10* (2013.01);
(Continued)

(58) Field of Classification Search
CPC   H03H 3/10; H03H 9/145; H03H 3/08; H03H 9/02; H03H 9/6489; H03H 9/25;
(Continued)

(56) References Cited

U.S. PATENT DOCUMENTS

| 6,132,575 A * | 10/2000 | Pandumsoporn ..... C23C 14/358 |
| | | 204/298.06 |
| 8,044,553 B2 | 10/2011 | Chen et al. |
| 2007/0296306 A1 | 12/2007 | Hauser et al. |

FOREIGN PATENT DOCUMENTS

CN    106435503 A    2/2017

OTHER PUBLICATIONS

"Investigation of SiO2 film properties for zero temperature coefficient of frequency SAW devices", S. Matsuda ; M. Miura ; T. Matsuda ; M. Ueda ; Y. Satoh ; K. Hashimoto IEEE International Ultrasonics Symposium Oct. 11-14, 2010.
(Continued)

*Primary Examiner* — Rakesh B Patel
*Assistant Examiner* — Jorge L Salazar, Jr.
(74) *Attorney, Agent, or Firm* — Hodgson Russ LLP (57) ABSTRACT

A method of reducing non-uniformity in the resonance frequencies of a surface acoustic wave (SAW) device, the SAW device comprising a silicon oxide layer comprising an oxide of silicon deposited over interdigital transducers on a piezoelectric substrate by reactive sputtering. The method comprises positioning a piezoelectric substrate having interdigital transducers on a substrate support, then depositing a silicon oxide layer comprising an oxide of silicon over the piezoelectric substrate and the interdigital transducers to form a SAW device. The substrate support is positioned relative to a sputtering target so that the silicon oxide layer of the SAW device has an arithmetic mean surface roughness ($R_a$) of 11 angstroms or less.

13 Claims, 7 Drawing Sheets

(51) Int. Cl.

| | |
|---|---|
| *C23C 14/08* | (2006.01) |
| *C23C 14/34* | (2006.01) |
| *C23C 14/35* | (2006.01) |
| *H03H 9/02* | (2006.01) |
| *H03H 9/145* | (2006.01) |
| *H03H 9/64* | (2006.01) |
| *H01L 41/053* | (2006.01) |
| *H01L 41/23* | (2013.01) |
| *C23C 14/10* | (2006.01) |
| *C23C 14/54* | (2006.01) |
| *H03H 3/08* | (2006.01) |
| *C23C 14/00* | (2006.01) |
| *H03H 3/04* | (2006.01) |

(52) U.S. Cl.
CPC ........ *C23C 14/345* (2013.01); *C23C 14/3485* (2013.01); *C23C 14/35* (2013.01); *C23C 14/545* (2013.01); *H01L 41/053* (2013.01); *H01L 41/23* (2013.01); *H03H 3/08* (2013.01); *H03H 9/02* (2013.01); *H03H 9/02559* (2013.01); *H03H 9/02834* (2013.01); *H03H 9/145* (2013.01); *H03H 9/14544* (2013.01); *H03H 9/25* (2013.01); *H03H 9/6489* (2013.01); *H03H 9/64* (2013.01); *H03H 2003/0442* (2013.01)

(58) Field of Classification Search
CPC ........... H03H 9/14544; H03H 9/02834; H03H 9/02559; H03H 2003/0442; H03H 9/64; C23C 14/0036; C23C 14/545; C23C 14/10; C23C 14/345; C23C 14/35; C23C 14/3485; C23C 14/08; H01L 41/23; H01L 41/053; H01L 41/22; H01L 41/09; H01L 41/1873; H01L 41/0533

USPC .......................................... 333/133, 193–196
See application file for complete search history.

(56) References Cited

OTHER PUBLICATIONS

"Correlation between propagation loss and silicon dioxide film properties for surface acoustic wave devices", Satoru Matsuda ; Michio Miura ; Takashi Matsuda ; Masanori Ueda ; Yoshio Satoh ; Ken-ya Hashimoto IEEE Transactions on Ultrasonics, Ferroelectrics, and Frequency Control ( vol. 60, Issue: 5, May 2013, pp. 993-997.

"Temperature coefficient of elastic constants of SiO2 over-layer on LiNbO3 for a temperature stable SAW device", Monika Tomar, Vinay Gupta and K Sreenivas, Department of Physics and Astrophysics, University of Delhi, Delhi 110007, India, Journal of Physics D: Applied Physics, vol. 36, No. 15 , Jul. 2003.

"A new model for the effect of grain size on the elastic modulus of nanocrystalline materials", Ali Shafiei M, Materials Science—Poland, vol. 27, No. 1, 2009.

"Optimizing the target-to-wafer spacing for highly uniform PVD films", Eric Paton, Ray Pena, Jeff Morioka, Karen Sprock, Jesus Morillo, Kao S. Tsu, Advanced Micro Devices, Inc. (USA), Proc. SPIE 3882, Process, Equipment, and Materials Control in Integrated Circuit Manufacturing V, 80 (Sep. 3, 1999); doi:10.1117/12.361327.

Temperature-Compensated Filter Technologies Solve Crowded Spectrum Challenges, Phil Warder, David Schnaufer, TriQuint Semiconductor Microwave Journal, Nov. 13, 2014.

Robert Aigner, "SAW, BAW and the future of wireless," EDN Network, May 6, 2013 http://www.edn.com/design/wireless-networking/4413442/SAW-BAW-and-the-future-of-wireless.

Sergey Mishin Et Al: "Production issues in using Silicon Dioxide films for temperature compensated Bulk and Surface Acoustic Wave devices", 2012 IEEE International Frequency Control Symposium Proceedings (May 21, 2012).

* cited by examiner

Figure 1

(Prior Art)

SAW DEVICE AND METHOD OF MANUFACTURE

The present invention relates to surface acoustic wave (SAW) devices, e.g. temperature-compensated SAW devices (TC-SAW) and methods of manufacturing a SAW device.

BACKGROUND

Surface acoustic wave (SAW) devices, e.g. filters, are a critical component in the RF front end of devices such as smartphones and tablets. SAW devices provide cheap and reliable RF filtering with high selectivity, low power and small footprint. A modern, multi-band, smartphone may contain 10 or more SAW devices and this number is only set to increase with every new smartphone release. As demand for SAW devices increases, production aspects of the constituent films require even tighter control in order to improve filter performance, maximize yield and reduce unit cost.

A typical SAW device comprises a polished piezoelectric crystal substrate, usually lithium niobate ($LiNbO_3$) or lithium tantalate ($LiTaO_3$), on which is deposited an arrangement of interdigital transducers (IDTs). The IDTs comprise interlocking comb-shaped arrays of metallic electrodes. An electrical signal applied to an IDT is converted into a mechanical surface acoustic wave in the piezoelectric substrate as a result of the piezoelectric effect. Once generated, a surface acoustic wave can travel across the substrate and may be manipulated through different types of signal processing devices formed by varying the geometry of the electrodes. The final SAW in the piezoelectric substrate can then be converted back to an electrical signal via another set of IDTs.

In order to improve the efficiency of the basic SAW device, a layer (overcoat) comprising an oxide of silicon (e.g. silicon dioxide) is deposited over the piezoelectric substrate and IDTs. The silicon oxide layer increases the mechanical stiffness of the IDTs, which improves the electromechanical coupling of SAW waves into the underlying piezoelectric substrate. The silicon oxide layer also plays an important role of reducing frequency drift of the device with temperature. Such devices may be known as temperature-compensated SAW devices.

A known technique to deposit silicon oxide thin films is reactive sputtering deposition whereby silicon particles are sputtered from a target toward a substrate and reacted with oxygen to form a layer of a silicon oxide on the substrate. Known forms of this technique include RF (radio frequency) sputtering, DC (direct current) sputtering, pulsed DC sputtering and pulsed DC magnetron sputtering.

An object of the invention is to improve the yield and performance of SAW devices having a silicon oxide layer comprising an oxide of silicon deposited by sputtering deposition by improving the frequency response of the SAW devices.

SUMMARY OF INVENTION

According to a first aspect of the invention, there is provided a method of reducing non-uniformity in the resonance frequencies of a surface acoustic wave (SAW) device, the SAW device comprising a silicon oxide layer comprising an oxide of silicon deposited on a piezoelectric substrate having interdigital transducers by reactive sputtering, the method comprising:

(i) positioning a piezoelectric substrate having interdigital transducers on a substrate support and depositing a silicon oxide layer comprising an oxide of silicon over the piezoelectric substrate and the interdigital transducers to form a first SAW device, the substrate support being positioned relative to a sputtering target so that the silicon oxide layer of the first SAW device has an arithmetic mean surface roughness ($R_a$) of 11 angstroms or less.

The inventors have discovered that for a SAW device having a silicon oxide layer (e.g. a silicon dioxide layer) deposited on a piezoelectric substrate, the frequency response of the device is influenced by the surface roughness of the silicon oxide layer. In particular, it has been determined that surface roughness of the silicon oxide layer correlates directly with non-uniformity of the frequency distribution within the device (i.e. the within-wafer (WIW) frequency non-uniformity). Without wishing to be constrained by any particular theory, it is postulated that the surface roughness relates directly to bulk film properties (e.g. density, elastic modulus), which is important for the acoustic response of device.

The inventors have also discovered that the roughness of a silicon oxide film deposited by a sputtering apparatus can be controlled by adjusting the distance between the target and the substrate support on which the piezoelectric substrate sits.

The SAW device produced by the method of the first aspect has a silicon oxide layer with an arithmetic mean surface roughness of 11 angstroms or less. This results in low non-uniformity of the frequency response across the device, which increases performance and yield.

The term "silicon oxide layer" used throughout the description and claims refers to a layer comprising at least one oxide of silicon, rather than a layer of stoichiometric SiO (but the term also encompasses this possibility). The silicon oxide layer may comprise silicon dioxide ($SiO_2$). The silicon oxide layer may be a silicon dioxide layer (though in practice, the layer is unlikely to be pure $SiO_2$).

The term "arithmetic mean surface roughness" refers to the surface roughness parameter commonly denoted as "$R_a$" and is a measure of the arithmetic mean deviation from a mean centre line. The arithmetic mean surface roughness of the silicon oxide layer may be measured using known techniques in the art, e.g. X-ray reflectometry or atomic force microscopy, and is measured across the whole surface of the silicon oxide layer.

The silicon oxide layer may not be the last (top-most) layer of the SAW device. Another layer or a plurality of layers may be present over the silicon oxide layer.

In some embodiments, the first SAW device has an arithmetic mean surface roughness of 10 angstroms or less. In some embodiments, the first SAW device has an arithmetic mean surface roughness of 9 angstroms or less. In some embodiments, the first SAW device has an arithmetic mean surface roughness of 8 angstroms or less. In some embodiments, the first SAW device has an arithmetic mean surface roughness of 7 angstroms or less.

The position of the substrate support relative to the target may be chosen by trial and error and may depend on the configuration of the apparatus used to carry out the sputtering deposition.

The method of the first aspect may further comprise the steps of:

(ii) adjusting the position of the substrate support; and
(iii) positioning a subsequent piezoelectric substrate on the substrate support and depositing a silicon oxide layer comprising an oxide of silicon on the subsequent piezoelectric substrate using the same target to form a second SAW device;

wherein the position of the substrate support in step (ii) is chosen so that the silicon oxide layer of the second SAW device also has a mean surface roughness of 11 angstroms or less.

An important aspect of high volume production of filter devices is maintaining device yield and performance across the lifetime of the target. In a sputtering apparatus, the effective distance between the target and the substrate may increase as the target is depleted. Furthermore, depletion of the target may be non-uniform across the surface of the target. This can lead to a drift in the silicon oxide film properties of SAW devices formed using a common target over the course of the target's life, which can result in device yield loss.

By adjusting the position of the substrate support, the effective distance between the target and the substrate support may be maintained so that SAW devices subsequent to the first SAW device may also be formed with an arithmetic mean surface roughness of 11 angstroms or less throughout the lifetime of the target.

In some embodiments, the silicon oxide layer of the first SAW device has an arithmetic mean surface roughness of 10 angstroms or less, and the position of the substrate support is chosen so that the silicon oxide layer of the second SAW device also has an arithmetic mean surface roughness of 10 angstroms or less. In some embodiments, the silicon oxide layer of the first SAW device has an arithmetic mean surface roughness of 9 angstroms or less, and the position of the substrate support is chosen so that the silicon oxide layer of the second SAW device also has an arithmetic mean surface roughness of 9 angstroms or less. In some embodiments, the silicon oxide layer of the first SAW device has an arithmetic mean surface roughness of 8 angstroms or less, and the position of the substrate support is chosen so that the silicon oxide layer of the second SAW device also has an arithmetic mean surface roughness of 8 angstroms or less. In some embodiments, the silicon oxide layer of the first SAW device has an arithmetic mean surface roughness of 7 angstroms or less, and the position of the substrate support is chosen so that the silicon oxide layer of the second SAW device also has an arithmetic mean surface roughness of 7 angstroms or less.

Steps (i) and (ii) do not need to be performed consecutively. For example, another or a plurality of silicon oxide depositions may be carried out to form another or a plurality of SAW devices after the first SAW device and before the position of the substrate support is adjusted. Furthermore, a SAW device formed between the first SAW device and adjusting the position of the substrate support may have a silicon oxide layer with a surface roughness falling outside the desired range. The detection of such a SAW device may provide an indication that the position of the substrate support should be adjusted.

Steps (ii) and (iii) of the first aspect may be repeated at least once during the lifetime of the target. Thus, the position of the substrate support can be adjusted as and when required to maintain a desired silicon oxide layer surface roughness throughout the lifetime of the target.

In such embodiments, repetitions of steps (ii) and (iii) do not need to be performed consecutively. For example, a plurality of silicon oxide depositions may be carried out to form a plurality of SAW devices between each substrate support adjustment. For example, after the second SAW device is formed, another or a plurality of SAW devices may be formed before adjusting the position of the substrate support again. Furthermore, a SAW device formed between the second SAW device and adjusting the position of the substrate support again may have a silicon oxide layer with a surface roughness falling outside the desired range. The detection of such a SAW device may provide an indication that the position of the substrate support should be adjusted.

The position of the substrate support may be adjusted by changing the separation distance between the target and the substrate support. For example, the position of the substrate support may be adjusted by moving the substrate support toward the target. As mentioned above, the target may be depleted as more sputtering operations are performed. Thus, by moving the substrate support toward the target, the effective distance between the substrate support and the target can be maintained to maintain a desired surface roughness.

The substrate support may be a platen.

The substrate support may be vertically moveable (relative to the target) to allow the distance between the substrate and the target to be adjusted.

The or each adjustment of the position of the substrate support may be based on a surface roughness measurement (e.g. by X-ray reflectometry or atomic force microscopy) of the silicon oxide layer of a previously formed SAW device. For example, during a production run of a plurality of SAW devices, a SAW device may be selected to test the surface roughness of its silicon oxide layer. If the surface roughness is found to be outside the desired (claimed) range or close to falling outside this range, then the position of the substrate support can be adjusted so that the next formed SAW device has a surface roughness falling within the desired (claimed) range.

The position of the substrate support may be adjusted by trial and error until the position of the substrate support results in the second SAW device having a silicon oxide layer surface roughness within the desired (claimed) range.

The or each adjustment of the position of the substrate support may be based on a look-up table. For example, the look-up table may provide a substrate support position value (e.g. a distance between the substrate support and the target, or a distance by which the substrate support should be moved) corresponding to a value of the elapsed lifetime of the target (e.g. in units of time or number of sputtering operations performed).

The or each silicon oxide layer may be deposited using a magnetron.

The or each silicon oxide layer may be deposited by known sputtering deposition techniques, e.g. RF sputtering deposition, or pulsed DC sputtering deposition.

The first and/or second SAW device or each SAW device may be a temperature-compensated SAW (TC-SAW) device.

The first and/or second SAW device or each SAW device may be a SAW filter.

The piezoelectric substrate may be a synthetic crystal, such as lithium niobate or lithium tantalate.

According to a second aspect of the invention, there is provided a surface acoustic wave (SAW) device comprising:
  a piezoelectric substrate having interdigital transducers deposited thereon; and
  a silicon oxide layer comprising an oxide of silicon deposited over the surface of the piezoelectric substrate and the interdigital transducers;
  wherein the silicon oxide layer has an arithmetic mean surface roughness of 11 angstroms or less.

As already mentioned, the inventors have discovered that for a SAW device having a silicon oxide layer deposited on a piezoelectric substrate, the frequency characteristic of the device is influenced by the surface roughness of the silicon oxide layer. In particular, it has been determined that surface roughness of the silicon oxide layer correlates directly with non-uniformity of the frequency distribution within the device (i.e. the within-wafer (WIW) frequency). By providing a SAW device having a silicon oxide layer with a mean surface roughness of 11 angstroms or less, the uniformity of the frequency distribution within the device is improved, thereby increasing performance and yield.

The silicon oxide layer may not be the last (top-most) layer of the SAW device. Another layer or a plurality of layers may be present over the silicon oxide layer.

In some embodiments, the silicon oxide layer of the SAW device has an arithmetic mean surface roughness of 10 angstroms or less. In some embodiments, the silicon oxide layer of the SAW device has an arithmetic mean surface roughness of 9 angstroms or less. In some embodiments, the silicon oxide layer of the SAW device has an arithmetic mean surface roughness of 8 angstroms or less. In some embodiments, the silicon oxide layer of the SAW device has an arithmetic mean surface roughness of 7 angstroms or less.

The silicon oxide layer of the SAW device of the second aspect may have been deposited over the piezoelectric substrate and the interdigital transducers by sputtering deposition, e.g. RF sputtering deposition, or pulsed DC sputtering deposition. The sputtering deposition may have been performed using a magnetron.

The SAW device may be a temperature-compensated SAW (TC-SAW) device.

The SAW device may be a SAW filter.

The piezoelectric substrate may be a synthetic crystal, such as lithium niobate or lithium tantalate.

According to a third aspect of the invention, there is provided an electronic circuit comprising at least one SAW device according to the second aspect.

According to a fourth aspect of the invention, there is provided an electronic device comprising at least one electronic circuit according to the third aspect or at least one SAW device according to the second aspect.

While the invention is described above, it extends to any inventive combination of the features set out above or in the following description, drawings, or claims.

BRIEF DESCRIPTION OF THE DRAWINGS

The invention will now be described, by way of example only, with reference to the accompanying drawings, in which.

DETAILED DESCRIPTION

Figure 1:
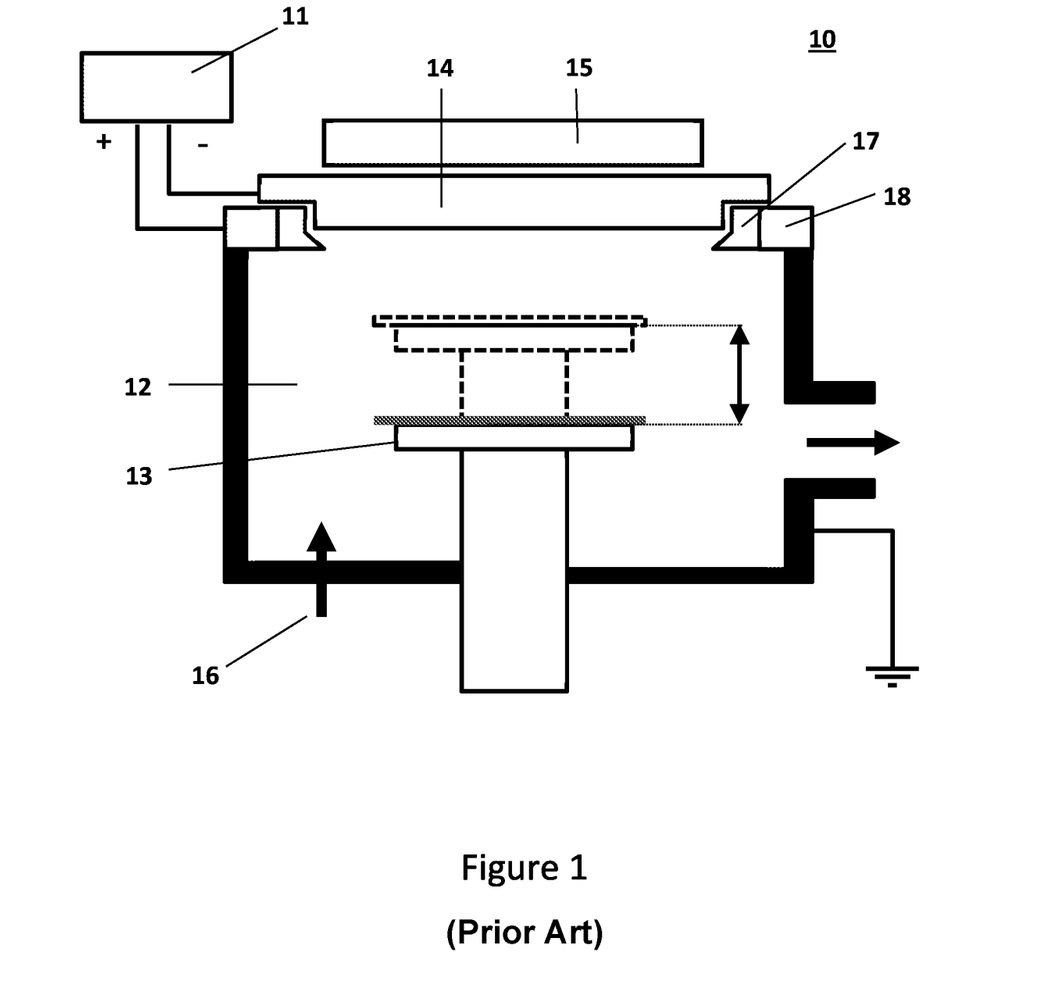
FIG. 1 is a schematic diagram of an apparatus that may be used to carry out the present invention.

FIG. 1 shows a typical apparatus 10 for carrying out the invention in the form of a pulsed DC magnetron reactive sputtering arrangement. The apparatus includes a vacuum chamber 12 within which is located a wafer platen 13. An upper portion of the chamber 12 includes a circular target 14, which can be formed from silicon or silicon dioxide. A pulsed DC power supply 11 is provided to apply pulsed DC power to the target 14, which acts as a cathode. The apparatus 10 further comprises an anode 17 in the form of an annular ring made of a metal (typically aluminium or stainless steel) which surrounds the perimeter of the target 14. The anode 17 is supported by an insulating part 18 (e.g. a ceramic insulator) to avoid it touching the grounded chamber 12 and to keep it isolated from the target 14 which is situated above it. A magnetron 15 of known type is located behind (above) the target 14.

In use, the platen 13 supports a substrate, typically a wafer, in opposition to the target 14. The platen 13 is formed from a conductive material which is biased with an RF signal provided by an RF power supply through a capacitive coupling circuit so that the platen 13 can act as an electrode. The RF bias in the presence of a plasma produces a negative DC bias to develop on the platen 13 so that sputtered ions are accelerated towards the substrate.

Additionally, the platen 13 can move vertically, so that the distance between the target 14 and the platen 13 can be adjusted. The target-to-platen distance (TTP) changes the angular distribution of the target ions landing on the substrate which affects the deposited film properties.

Sources of oxygen and argon are provided. Oxygen ($O_2$) and argon (Ar) are selectively admitted into the chamber 12 through a gas inlet 16 using mass flow controllers as part of an appropriate gas manifold. Oxygen gas reacts with silicon sputtered from the target 14 to form a layer comprising an oxide of silicon on the surface of a substrate positioned on the platen 13. PVD systems that can be used in connection with the invention, or can be readily adapted for use in connection with the invention, are available commercially. For example, the applicant's own Sigma® fxP™ PVD system can used with a desired magnetron.

Example operating conditions for the silicon oxide sputtering deposition process are: a target power of 2 kW, a sputtering gas flow mixture of 10 sccm Ar and 50 sccm $O_2$, a platen temperature of 50° C. and a platen DC bias of approximately 100V or higher.

Figure 2:
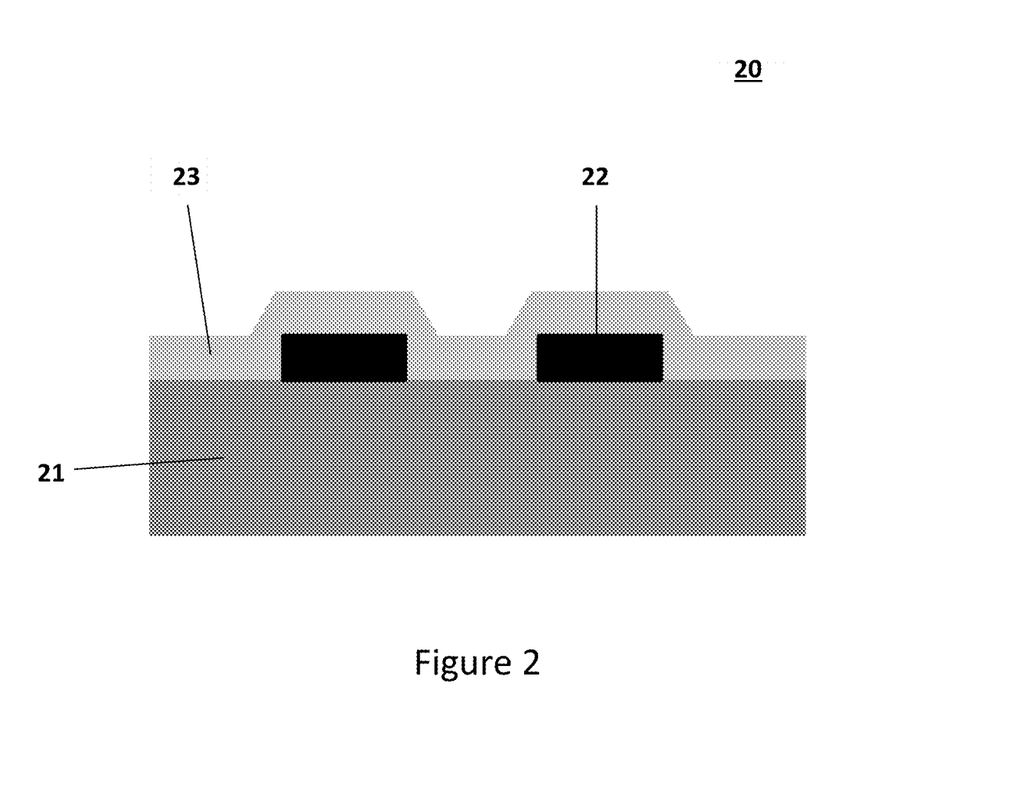
FIG. 2 is a schematic diagram of a SAW device according to the present invention.

FIG. 2 shows a schematic of a SAW device 20 produced by apparatus 10. The device 20 comprises a piezoelectric substrate 21, e.g. lithium niobate ($LiNbO_3$) or lithium tantalate ($LiTaO_3$). Metal electrodes 22 forming interdigital transducers are deposited on the substrate 21. A silicon oxide layer 23 is deposited over the substrate 21 and electrodes 22.

Silicon Oxide Roughness and SAW Frequency Response

Experiments were performed to investigate the correlation between the average (arithmetic mean) surface roughness of the silicon oxide layer and the within-wafer (WIW) standard deviation of centre frequency (which is a measure of non-uniformity of frequency response) of a SAW device.

The SAW devices used in the experiments comprised a LiNbO$_3$ substrate with a 200 nm silicon oxide layer deposited using the above-described apparatus 10. The arithmetic mean surface roughness was measured in angstroms by X-ray reflectometry (XRR) using a commercially available system.

Figure 3:
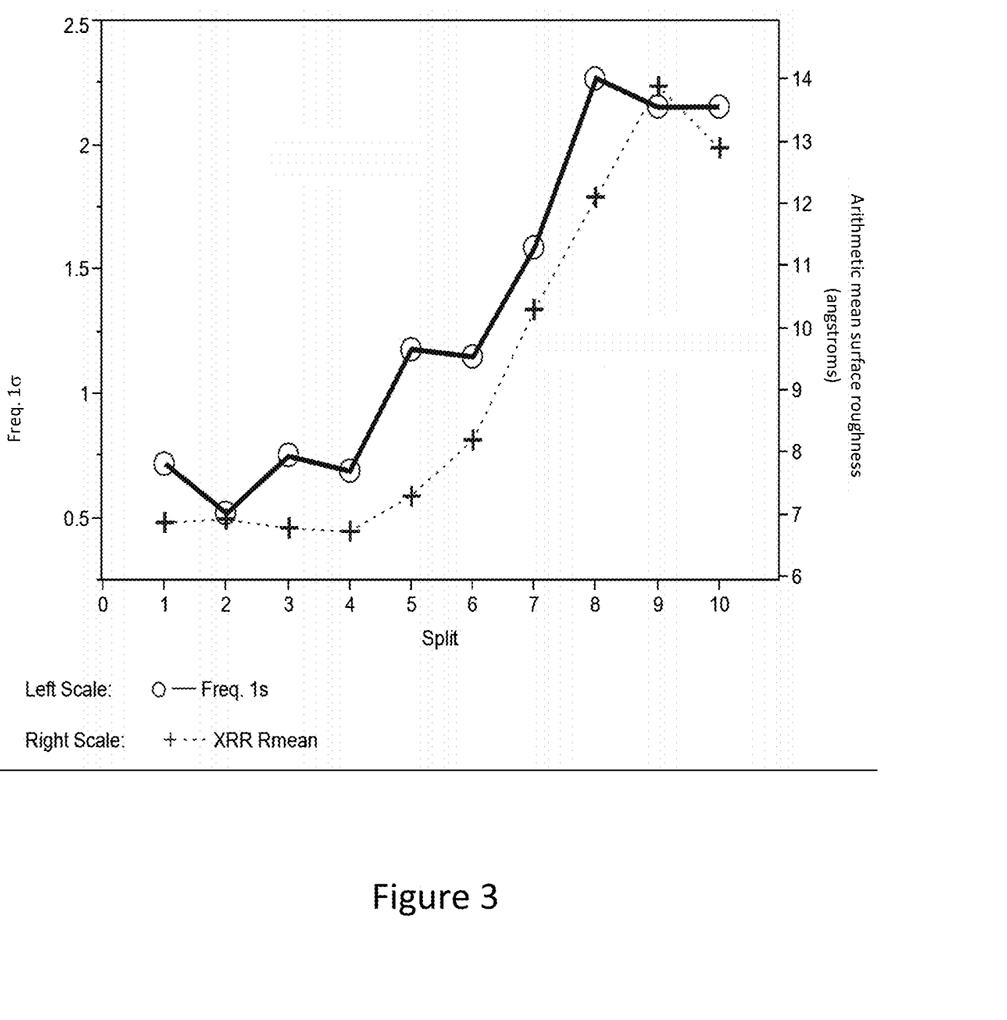
FIG. 3 is a graph showing the relationship between frequency non-uniformity of a SAW device and the surface roughness of its silicon oxide layer.

The results, shown in the graph of FIG. 3, show a strong correlation between mean silicon oxide film roughness and WIW standard deviation of centre frequency. The graph correlates data from 11 experiments varying both hardware configuration (e.g. magnetron geometry) and process parameters. Film thickness, density and refractive index did not show a strong correspondence with frequency non-uniformity. Surface roughness was found to be the only measured blanket film parameter that could be correlated directly to WIW frequency non-uniformity across such widely varying conditions. The graph indicates that a mean surface roughness of about 11 angstroms or less provides good uniformity in the frequency response.

Roughness Optimization with Target-to-Platen Distance

Figure 4:
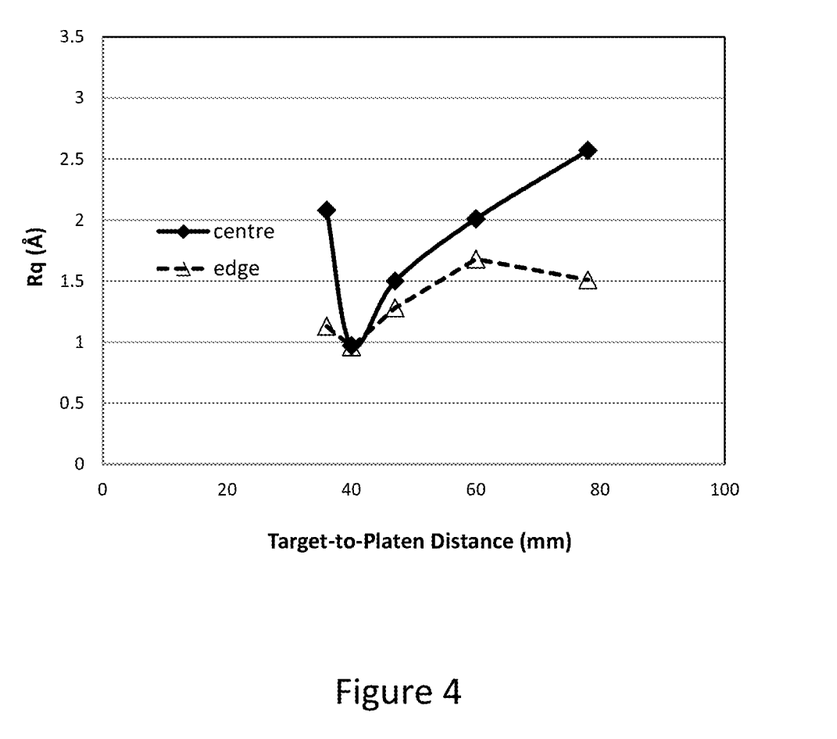
FIG. 4 is a graph showing how RMS surface roughness at the centre and at the edge of a wafer varies with the target-to-platen distance used.

The inventors have also discovered that the surface roughness of silicon oxide films formed by sputtering deposition can be optimized by adjusting the distance between the target 14 and the platen 13. FIG. 4 shows a graph of RMS surface roughness (Rq) at the centre and at the edge of a 200 nm silicon oxide film using different target-to-platen distances. The surface roughness values were measured over a 1000 nm by 1000 nm area using a high resolution atomic force microscope (AFM) in non-contact mode. With a standard D-type magnetron design, an optimal distance is observed in this example at a target-to-platen distance (TTP) of approximately 40 mm. This distance resulted in a RMS surface roughness of approximately 1.0 angstrom at both the centre and edge of the wafer.

Figure 5:
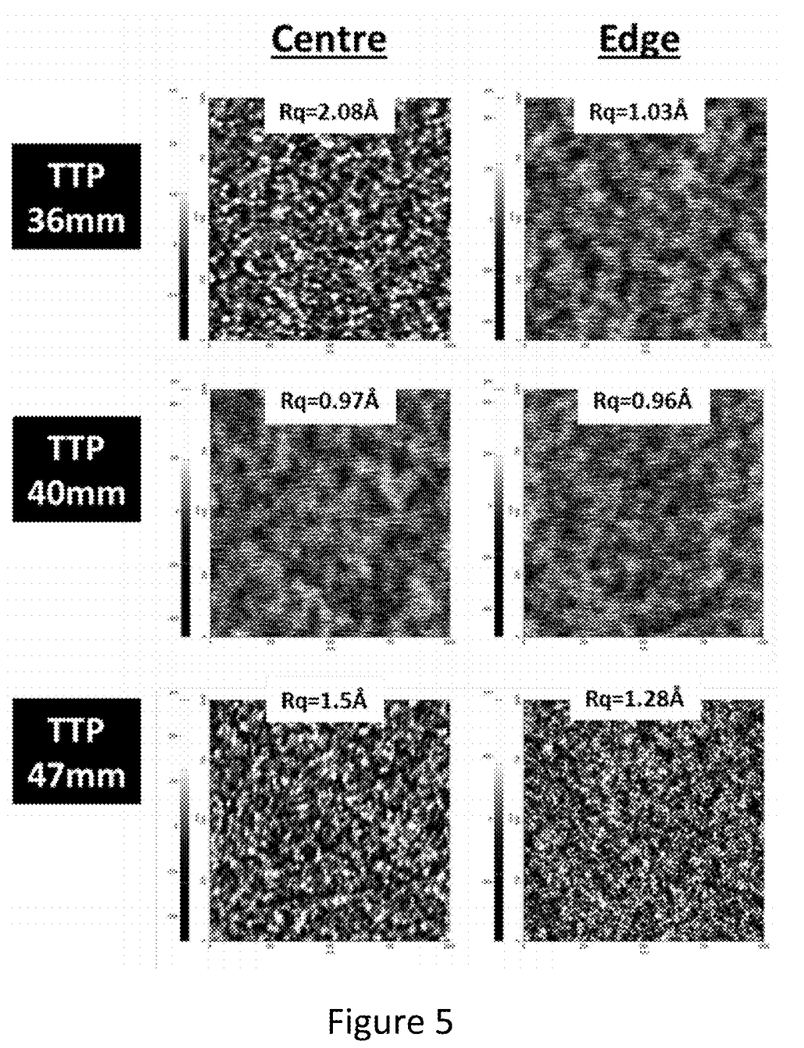
FIG. 5 shows topography images obtained by atomic force microscopy for centre and edge regions of wafers in which different target-to-platen (TTP) distances were used when depositing the silicon oxide layer.

The corresponding AFM topography images are shown in FIG. 5. Away from the optimal target-to-platen distance, a clear difference can be observed between the topography at the centre and the edge of the wafer, with the film generally being rougher in the centre than the edge and some fine grain structure is observable. At the optimal TTP of 40 mm, no discernible difference in roughness can be observed between the centre and edge of the wafer and there is little observable structure.

The optimal target-to-platen height is found to depend on the individual apparatus configuration, e.g. on the magnetron design (field strength, geometry) but it does not directly correspond to thickness non-uniformity, which also varies with target-to-platen distance. This is shown in Tables 1 and 2.

TABLE 1

RMS roughness Rq (measured by AFM) and thickness non-uniformity %1σ versus target-to-platen distance (TTP) for a silicon oxide film deposited using a SPTS Sigma® fxP™ PVD system with magnetron A.

| TTP mm | Rq(Å) centre | Rq(Å) edge | Thickness %1σ |
|---|---|---|---|
| 36 | 2.08 | 1.13 | 1.44 |
| 40 | 0.97 | 0.96 | 1.4 |
| 47 | 1.5 | 1.28 | 1.32 |
| 60 | 2.01 | 1.68 | 3.72 |
| 78 | 2.57 | 1.51 | 3.96 |

TABLE 2

RMS roughness Rq (measured by AFM) and thickness non-uniformity versus target-to-platen distance (TTP) for a silicon oxide film deposited using a different magnetron B.

| TTP mm | Rq(Å) centre | Rq(Å) edge | Thickness %1σ |
|---|---|---|---|
| 47 | 68.63 | 6.1 | 12.92 |
| 60 | 7.55 | 2.1 | 6.1 |
| 78 | 3.52 | 1.49 | 4.64 |

The terms 'magnetron A' and 'magnetron B' are merely descriptors, to indicate that different magnetrons were used. The invention is not limited with respect to the type of magnetron used.

Figure 6:
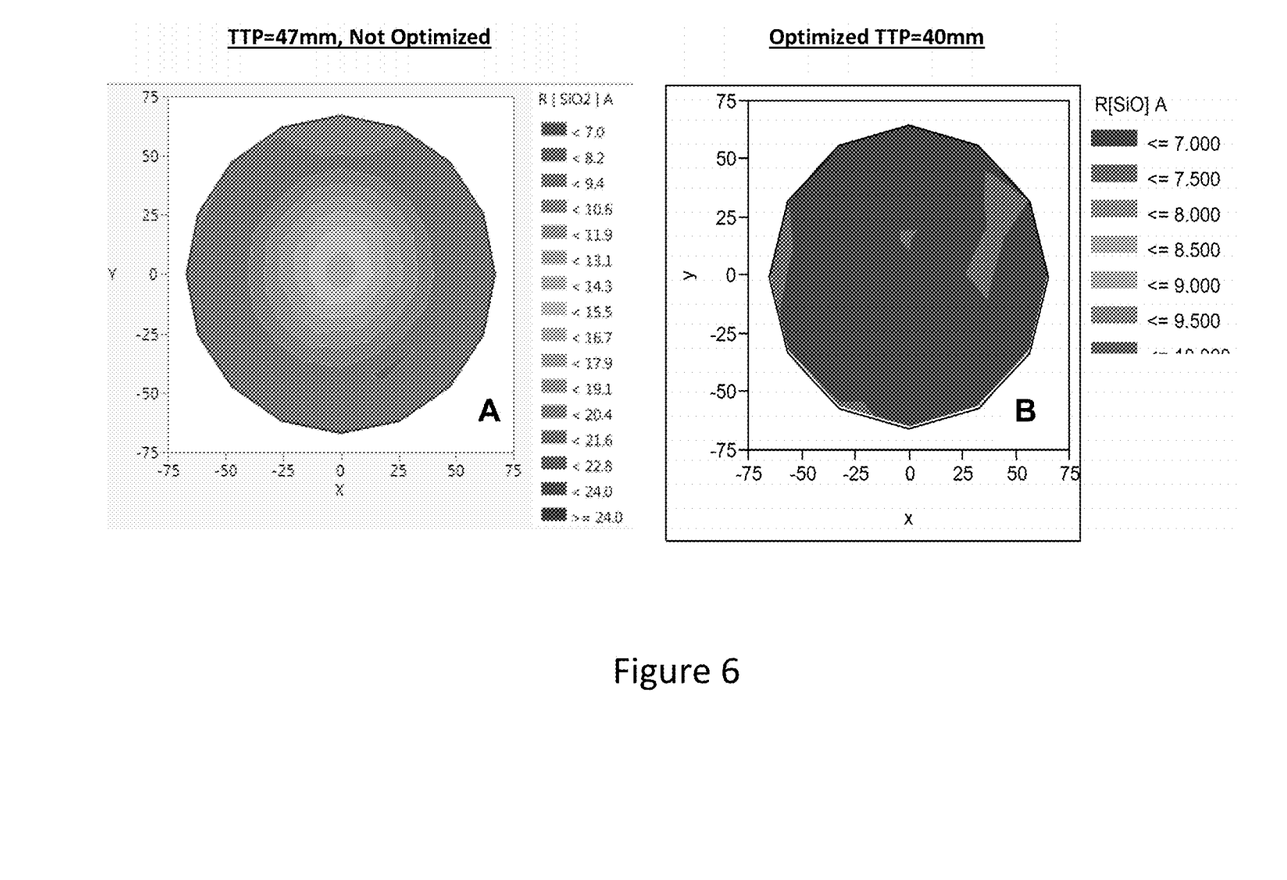
FIG. 6 shows surface roughness distributions obtained by X-ray reflectometry (XRR) for a silicon oxide film deposited using a target-to-platen distance away from an optimum distance (left side of the Figure, labelled A) and for a silicon oxide film deposited using a target-to-platen distance optimised for minimum silicon oxide roughness (right side of the Figure, labelled B).
Figure 7:
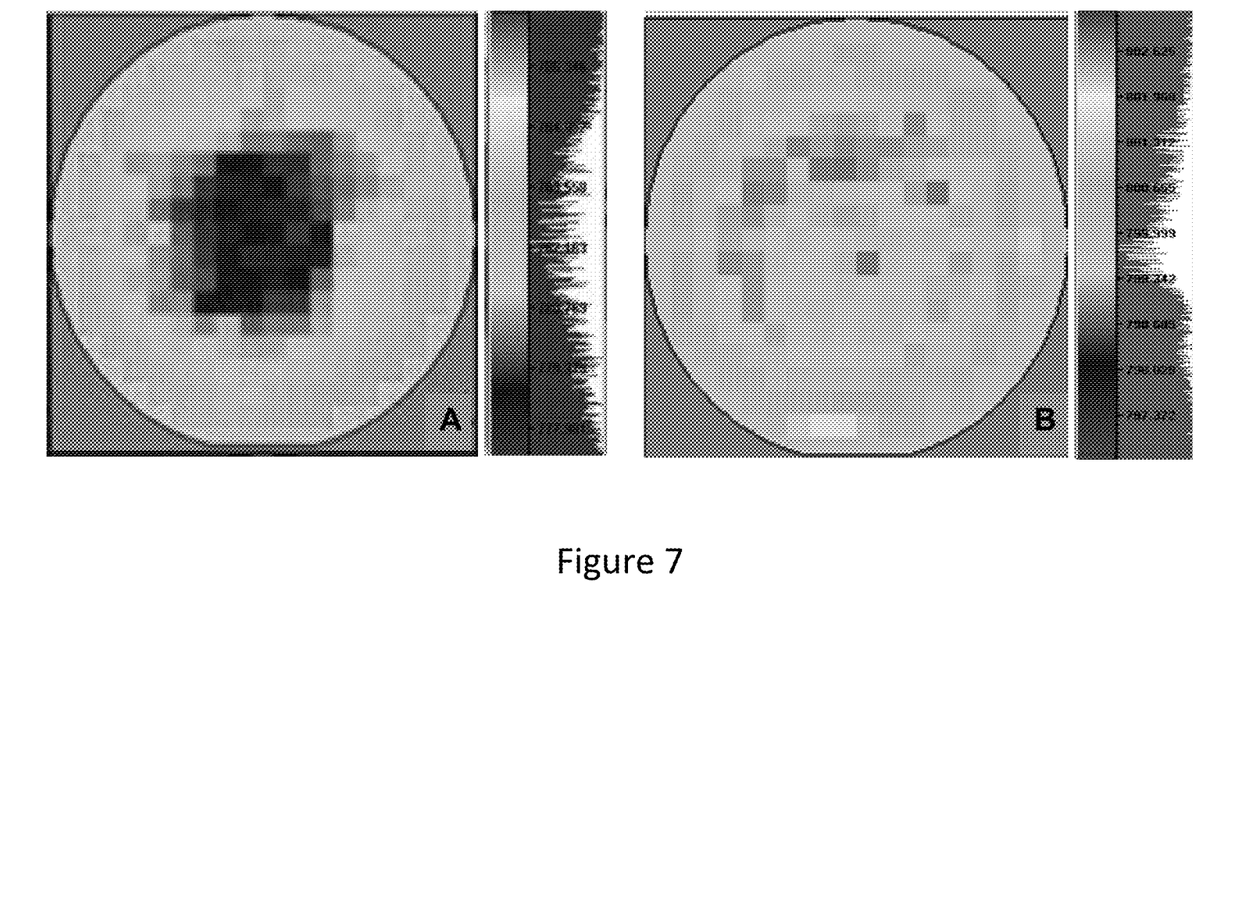
FIG. 7 shows a frequency distribution map for a SAW devices corresponding to the devices of FIG. 6.

With the surface roughness of silicon oxide films characterized, SAW devices were fabricated and tested. A clear relationship was observed between the silicon oxide layer surface roughness and the frequency distribution of the SAW devices. FIG. 6 shows XRR roughness maps for a 200 nm silicon oxide layer deposited on a 150 mm wafer at a suboptimal TTP distance of 47 mm (left side of FIG. 6); and at an optimal TTP distance of 40 mm (right side of FIG. 6). FIG. 7 shows corresponding frequency distribution maps of the devices. It can be seen that away from the optimal TTP distance, both the XRR roughness map and the frequency distribution show a distinct bulls-eye pattern with higher roughness corresponding to a lower centre-frequency of the SAW devices. This frequency non-uniformity can lead to a reduction in product yield. However when the TTP distance was optimized with respect to silicon oxide surface roughness, the frequency distribution of the SAW devices was uniform across the whole wafer resulting in fewer rejected devices and increased product yield.

Correction Through Target Lifetime

An important aspect of high volume production of RF filter devices is maintaining device yield and performance across the whole of the target's lifetime. In the apparatus 10 described earlier, the effective target-to-platen distance increases as the target 14 gets used up. This can lead to a drift in the silicon oxide film properties over the course of the target's lifetime resulting in significant device yield loss. The optimal target-to-platen distance can be re-established at intervals through the target's lifetime by making roughness measurements and adjusting the target-to-wafer distance accordingly in order to maintain frequency performance and yield.

The invention claimed is:

1. A method of reducing non-uniformity in the resonance frequencies of a surface acoustic wave (SAW) device, the SAW device comprising a silicon oxide layer comprising an oxide of silicon deposited over interdigital transducers on a piezoelectric substrate by reactive sputtering, the method comprising:
  (i) positioning the piezoelectric substrate having the interdigital transducers on a substrate support and depositing the silicon oxide layer comprising the oxide of silicon over the piezoelectric substrate and the interdigital transducers to form a first SAW device of the SAW device, the substrate support being positioned relative to a sputtering target so that the silicon oxide layer of the first SAW device has an arithmetic mean surface roughness (R$_a$) of 11 angstroms or less;
  (ii) adjusting the position of the substrate support; and
  (iii) positioning a subsequent piezoelectric substrate having further interdigital transducers on the substrate support and depositing a further silicon oxide layer comprising an oxide of silicon over the subsequent piezoelectric substrate and the further interdigital transducers using the sputtering target to form a second SAW device of the SAW device;

wherein the position of the substrate support in step (ii) is chosen so that the further silicon oxide layer of the second SAW device has an arithmetic mean surface roughness ($R_a$) of 11 angstroms or less.

2. The method of claim 1, wherein the SAW device is a temperature-compensated SAW device.

3. The method of claim 1, wherein steps (ii) and (iii) are repeated at least once during a lifetime of the sputtering target.

4. The method of claim 1, wherein the position of the substrate support is adjusted by changing a separation distance between the substrate support and the sputtering target.

5. The method of claim 1, wherein the adjustment of step (ii) is based on a surface roughness measurement of the silicon oxide layer of the first SAW device.

6. The method of claim 1, wherein the position of the substrate support is adjusted based on a look-up table.

7. The method of claim 6, wherein the look-up table provides a position adjustment value corresponding to a value of an elapsed lifetime of the sputtering target.

8. The method of claim 1, wherein the substrate support is vertically movable.

9. The method of claim 1, wherein each of the silicon oxide layers is deposited using a magnetron.

10. The method of claim 1, wherein each of the silicon oxide layers is deposited by a DC sputtering deposition.

11. The method of claim 10, wherein the DC sputtering deposition is pulsed DC sputtering deposition.

12. The method of claim 11, wherein the pulsed DC sputtering deposition is pulsed DC magnetron sputtering deposition.

13. The method of claim 1, wherein the SAW device is a SAW filter.

* * * * *